United States Patent
Cui et al.

(10) Patent No.: US 12,061,219 B2
(45) Date of Patent: Aug. 13, 2024

(54) POWER METER AND METHOD THEREOF

(71) Applicant: Accuenergy (Canada) Inc., Toronto (CA)

(72) Inventors: Shaohang Cui, Toronto (CA); Ketao Li, Toronto (CA); Yufan Wang, Toronto (CA); Liang Wang, Toronto (CA)

(73) Assignee: Accuenergy (Canada) Inc., Toronto (CA)

( * ) Notice: Subject to any disclaimer, the term of this patent is extended or adjusted under 35 U.S.C. 154(b) by 272 days.

(21) Appl. No.: 17/835,548

(22) Filed: Jun. 8, 2022

(65) Prior Publication Data
US 2023/0400485 A1  Dec. 14, 2023

(51) Int. Cl.
*G01R 22/06* (2006.01)
*G06F 1/28* (2006.01)

(52) U.S. Cl.
CPC .............. *G01R 22/068* (2013.01); *G06F 1/28* (2013.01)

(58) Field of Classification Search
CPC .......... G01R 22/068; G01R 35/00; G06F 1/28
See application file for complete search history.

(56) References Cited

U.S. PATENT DOCUMENTS

| | | | |
|---|---|---|---|
| 8,375,243 B1 | 2/2013 | Lutter | |
| 9,372,742 B2 | 6/2016 | Chun et al. | |
| 10,890,616 B2 | 1/2021 | Huang et al. | |
| 11,032,905 B2* | 6/2021 | Lassini | G05D 1/0077 |
| 11,721,142 B2* | 8/2023 | Paty | B60W 50/0205 |
| | | | 701/31.7 |
| 2004/0153834 A1* | 8/2004 | Oshima | G06F 11/0751 |
| | | | 714/E11.002 |
| 2007/0001720 A1* | 1/2007 | Li | G06F 1/28 |
| | | | 327/143 |
| 2007/0118638 A1* | 5/2007 | Ban | G05B 23/0272 |
| | | | 709/224 |
| 2017/0115195 A1* | 4/2017 | Zuo | A01C 23/047 |
| 2020/0389499 A1* | 12/2020 | Koval | H04L 9/3268 |
| 2022/0263315 A1* | 8/2022 | Gupta | H02J 3/0012 |

* cited by examiner

*Primary Examiner* — Jermele M Hollington
*Assistant Examiner* — Zannatul Ferdous
(74) *Attorney, Agent, or Firm* — Dhiraj Jindal; PATENT YOGI LLC

(57) ABSTRACT

Provided are a method and apparatus for system self-recovery. Specifically, a power meter employs a method in which a processor monitors the status of threads running in the power meter. The threads include at least one critical thread for measuring electricity usage at a metering point and at least one noncritical thread for other auxiliary functions. The Power meter can reboot if the status received from the threads indicates that a critical thread among the at least one critical thread works abnormally, and can restart the noncritical thread if the status received from the threads indicates that a noncritical thread among the at least one noncritical thread works abnormally.

8 Claims, 6 Drawing Sheets

POWER METER AND METHOD THEREOF

FIELD OF THE INVENTION

The present disclosure generally relates to the field of power meters for electrical utility services and, more specifically, methods and devices for system self-recovery.

BACKGROUND

Monitoring electrical energy is a fundamental function within any electrical power distribution system. Electrical energy may be monitored to determine usage and power quality. A device that monitors electrical energy may be a power meter.

With the growth of renewable energy, such as wind and solar power, more and more power meters are being deployed in rural areas, sometimes hundreds of kilometers from the utility service center. When a power meter fault occurs, it is challenging to dispatch field crews to fix it in time. Therefore, a power meter with a self-recovery capability would be desirable.

SUMMARY OF THE INVENTION

According to an aspect of the present disclosure, a method for monitoring a power meter is disclosed. The method includes monitoring the status of threads running in the power meter, wherein the threads include at least one critical thread for measuring an electricity usage at a metering point and at least one noncritical thread for other auxiliary functionalities, rebooting the power meter if the status received from the threads indicates that a critical thread among the at least one critical thread works abnormally, restarting the noncritical thread if the status received from the threads indicates that a noncritical thread among the at least one noncritical thread works abnormally.

The method can further include counting the occurrence frequency that the critical thread works abnormally during a specified period and switching the power meter into an emergency mode where only network functionality is enabled in the power meter when the occurrence frequency exceeds a predetermined frequency threshold.

The method can further include notifying a power meter user that the power meter will be switched into the emergency mode. The notification function can include generating a random password for a webserver program residing in the power meter, wherein the webserver program allows a power meter user to collect the power meter's logged information or update the power meter firmware, obtain address information for the webserver program, get the current time for when the power meter will be switched into the emergency mode, and send the random password, the address information, and the current time to the power meter user.

The method can further include calculating the first occurrence frequency that the power meter reboots during a first specified period, computing second occurrence frequency that a noncritical thread restarts during the first specified period, estimating a performance score for the power meter according to the first occurrence frequency, the second occurrence frequency, and specified weighting coefficients, and then notifying the performance score to a power meter user.

The status of threads of the method can further include at least one of: a loop count of each the threads during a second period, a load of each of the threads, and a resource operation status of each of the threads.

The method can further include periodically feeding a watchdog program to indicate that the monitoring functionality is still alive.

The method can further include recording a Linux snapshot before rebooting the power meter and logging the failure information before restarting the noncritical thread.

The method can further include monitoring the power meter initialization process and switching the power meter into an emergency mode where only network functionality is enabled in the power meter if the critical thread cannot normally work due to the failing power meter initialization.

According to another aspect of the present disclosure, a power meter is disclosed. The power meter includes at least one sensor configured for sensing at least one electrical parameter of electrical power distributed from an electrical distribution system to a load; at least one analog-to-digital converter coupled to the at least one sensor and configured for converting an analog signal output from the at least one sensor to digital data; and at least one processing module coupled to the at least one analog-to-digital converter. The at least one processing module is configured to: monitor status of threads running in the power meter, wherein the threads include at least one critical thread for measuring the electricity usage at a metering point and at least one noncritical thread for other auxiliary functions, reboot the power meter if the status received from the threads indicates that a critical thread among the at least one critical thread works abnormally, and restart the noncritical thread if the status received from the threads indicates that a noncritical thread among the at least one noncritical thread works abnormally.

The at least one processing module of the power meter can be further configured to count the occurrence frequency that the critical thread works abnormally during a specified period, and to switch the power meter into an emergency mode where only network functionality is enabled in the power meter if the occurrence frequency exceeds a predetermined frequency threshold.

The at least one processing module of the power meter can be alternatively further configured to calculate first occurrence frequency that the power meter reboots during a first specified period, to compute second occurrence frequency that the noncritical thread restarts during the first specified period, to estimate a performance score for the power meter according to the first occurrence frequency, the second occurrence frequency and specified weighting coefficients and to notify the performance score to a power meter user.

These and other features and aspects of the present disclosure will become fully apparent from the following detailed description of exemplary embodiments, the appended claims, and the accompanying drawings.

DETAILED DESCRIPTION

Embodiments of the present disclosure can be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be constructed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

Figure 1:
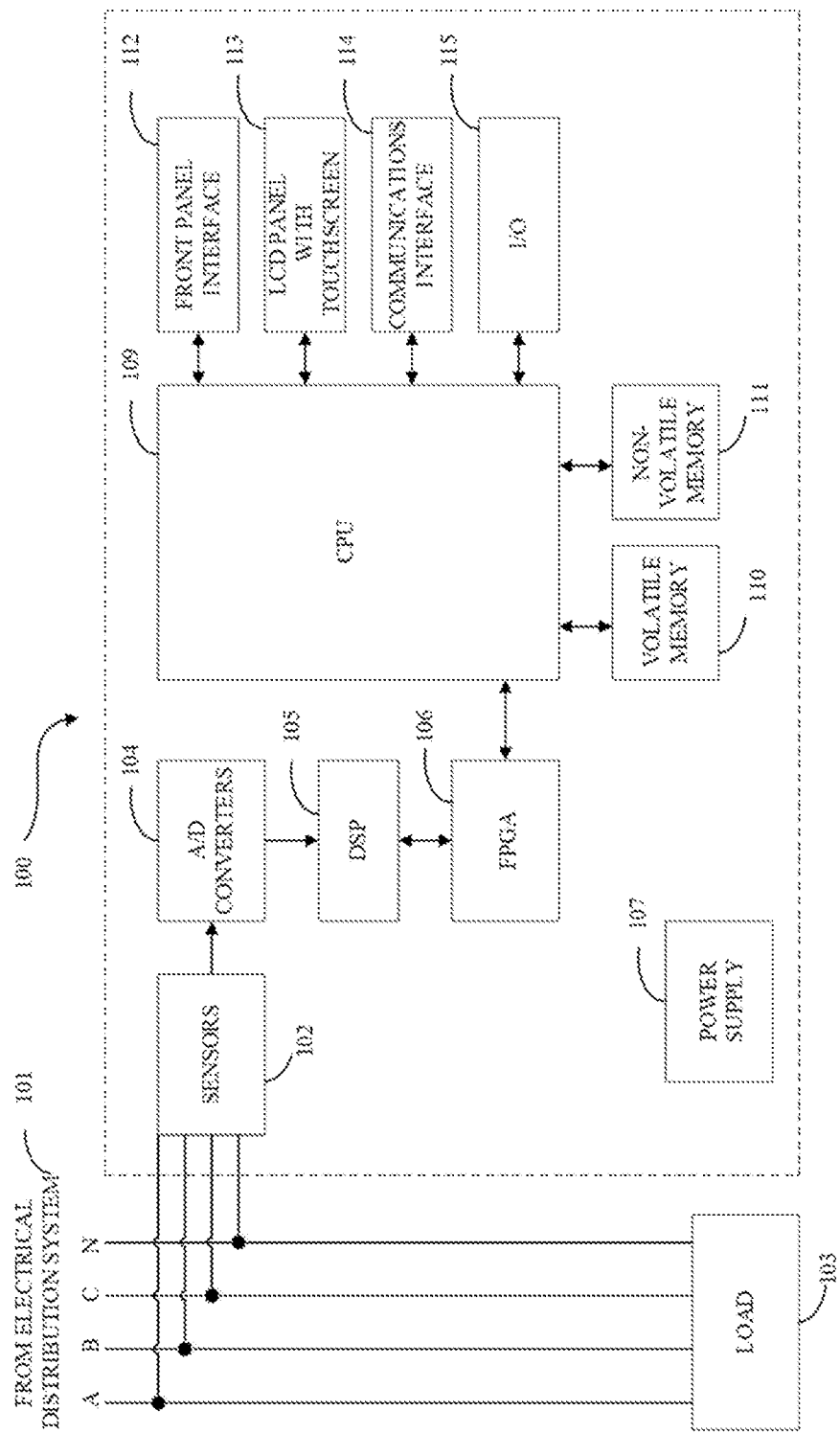
FIG. 1 is a block diagram of a power meter according to an exemplary embodiment of the present disclosure.

FIG. 1 is possible embodiment of a block diagram of a power meter 100 for monitoring power usage and power quality for any metering point within a power distribution system.

The power meter 100 illustrated in FIG. 1 can include multiple sensors 102 coupled with various phases A, B, C, and N (neutral) of an electrical distribution system 101, multiple analog-to-digital (A/D) converters 104, a power supply 107, volatile memory 110, non-volatile memory 111, a front panel interface 112, and/or a processing module that includes at least one Central Processing Unit (CPU) and/or one or more Digital Signal Processors (DSP), two of which are shown DSP 105 and CPU 109. The power meter 100 may also includes a Field Programmable Gate Array (FPGA) 106 which performs several functions, including acting as a communications bridge for transferring data between the various processors (105 and 109).

The sensors 102 can sense electrical parameters, such as voltage and/or current, on incoming lines (phase A, phase B, phase C, and neutral N) of an electrical power distribution system 101 that are coupled to at least one load 103 that consumes the provided power. In one embodiment, the sensors 102 include current transformers and potential transformers, where one current transformer and one voltage transformer can be coupled to each phase of the incoming power lines. The primary winding of each transformer can be coupled to the incoming power lines and the secondary winding of each transformer can output a voltage representative of the sensed voltage and current. The output of each transformer can be coupled with the A/D converters 104 which are configured to convert the analog voltage output from the transformer to a digital signal that can be processed by the DSP 105.

A/D converters 104 can be configured to convert an analog voltage output to a digital signal that may be transmitted to a gate array, such as Field Programmable Gate Array (FPGA) 106. The digital signal can then be transmitted from the FPGA 106 to the CPU 109.

The CPU 109 or DSP Processors 105 or a combination thereof can be configured to receive digital signals from the A/D converters 104 and can perform the necessary calculations to determine power usage and control the overall operations of the power meter 100. In some embodiments, the CPU 109 and DSP 105 may be combined into a single processor to serve the functions of each component. In some embodiments, it can be possible to use an Erasable Programmable Logic Device (EPLD), a Complex Programmable Logic Device (CPLD), or any other programmable logic device in place of the FPGA 106. In some embodiments, the digital samples, which can be output from the A/D converters 104 can be sent directly to the CPU 109, which may effectively bypass the DSP 105 and/or the FPGA 106 as a communications gateway.

The power supply 107 may provide power to each component of the power meter 100. In one embodiment, the power supply 107 may be a transformer with its primary windings that can be coupled to the incoming power distribution lines, which can provide a nominal voltage at its secondary windings. In other embodiments, power may be supplied from an independent power source to the power supply 107.

The front panel interface 112 can be coupled to the CPU 109 which may include indicators, switches, various inputs or a combination thereof.

The LCD panel that can have a touchscreen 113 can be coupled to the CPU 150 for interacting with a user and for communicating events, such as alarms and instructions. The LCD panel with touchscreen 113 may provide information to the user which can take the form of alpha-numeric lines, computer-generated graphics, videos, animations, etc.

An input/output (I/O) interface 115 may be provided for receiving externally generated inputs from the power meter 100 and/or for outputting data, such as serial data, to other devices. In one embodiment, the I/O interface 115 may include a connector for receiving various cards and/or modules that can increase and/or change the functionality of the power meter 100.

The power meter 100 may also include volatile memory 110 and/or non-volatile memory 111. The volatile memory 110 may store the sensed and/or generated data for further processing and/or for retrieval, which may be when it is requested to be displayed at the power meter 100 or from a remote location. The volatile memory 110 may include internal storage memory, such as Random-Access Memory (RAM). The non-volatile memory 111 can include removable memory, such as magnetic storage memory, optical storage memory (such as various types of CD or DVD media), solid-state storage memory, (such as a Compact-Flash card, a Memory Stick, SmartMedia card, MultiMediaCard [MMC], SD [Secure Digital] memory), or any other memory storage that exists currently or can exist in the future. Such memory can be used for storing historical trends, waveform captures, event logs (including time-stamps), and stored digital samples for later download to a client application, webserver, or PC application.

In some embodiments, the power meter 100 may include a communication interface 114, also known as a network interface, for enabling communications between the power meter, and a remote terminal unit or programmable logic controller and other computing devices, microprocessors, desktop computers, laptop computers, other meter modules, etc. The communication interface 114 may be a modem, Network Interface Card (NIC), wireless transceiver, or other interface. The communication interface 114 can operate with hardwired and/or wireless connectivity. A hardwired connection may include, but is not limited to, physical cabling (such as parallel cables serial cables, RS232, RS485, USB cables, or Ethernet), an appropriately configured communication port or a combination thereof. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The power meter 100 may communicate to a server or other computing device via the communication interface 114. The power meter 100 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server can communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one power meter and/or storing data to be retrieved by the power meter.

In an additional embodiment, when a power event occurs, such as a voltage surge, voltage sag, or current short circuit, the power meter 100 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform can also allow the CPU 109 to compute other electrical parameters such as harmonics, magnitudes, symmetrical components, and phasor analysis.

In a further embodiment, the power meter 100 can execute an e-mail client and can send notification e-mails to the utility, or directly to the customer, when a power quality event occurs, for example. This may allow utility companies to dispatch crews to repair the condition. The data generated by the meters may be used to diagnose the cause of the condition. The data can be transferred through the infrastructure that may be created by the electrical power distribution system. The e-mail client can utilize POP3 or another standard e-mail protocol.

The techniques of the present disclosure can be used to automatically maintain program data and provide field-wide updates upon which power meter firmware and/or software can be upgraded. An event command can be issued by a user, on a schedule, or through a digital communication that may trigger the power meter 100 to access a remote server and can obtain the new program code. This can ensure that program data can be maintained, assuring the user that all information is displayed identically on all units.

It is to be understood that the present disclosure may be implemented in various forms of hardware, software, firmware, special purpose processors, or a combination thereof. The power meter 100 also includes an operating system and application program. The various processes and functions described herein may either be part of an application program (or a combination thereof) which is executed via the operating system.

Because some of the system components and methods depicted in the accompanying figures may be implemented using either software or firmware, it is to be further understood that the actual connections between the system components (or the process steps) may differ depending on the specific way the present disclosure is programmed. Given the teachings of the present disclosure provided herein, one of ordinary skill in the related art can be able to contemplate these and similar implementations or configurations of the present disclosure.

Figure 2:
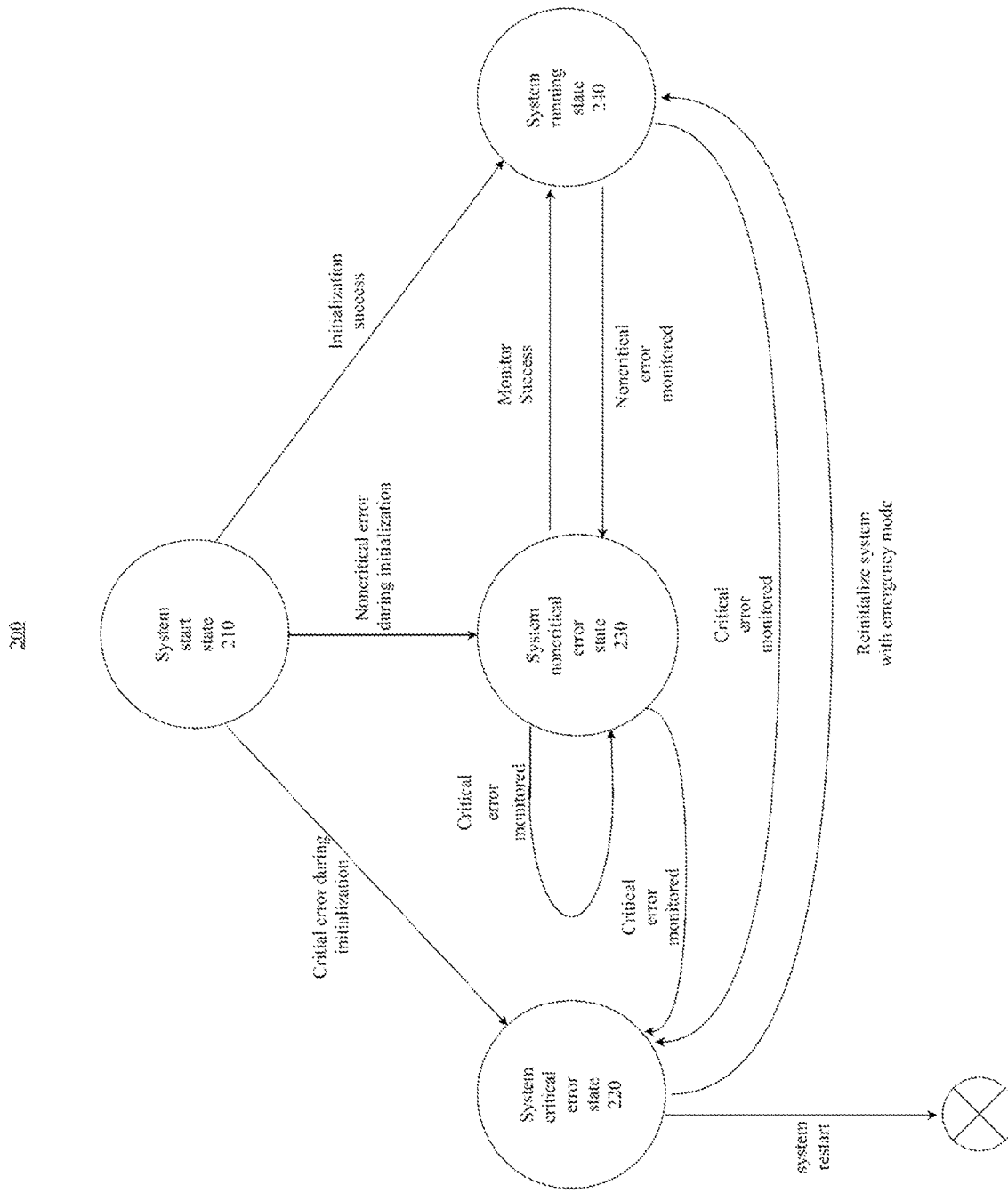
FIG. 2 is a state machine diagram of the power meter.

FIG. 2 is a state machine diagram 200 of a power meter 100. There are a total of five states in the power meter 100. System start state 210 is the initial state of the power meter 100. When the power meter 100 starts, it can enter the system start state 210. After the power meter 100 starts, it can initialize all the necessary resources. The power meter 100 can enter system critical error state 220 when a critical error occurs during power meter initialization or power meter monitoring. The power meter 100 can enter system noncritical error state 230 when a noncritical error occurs during power meter initialization or power meter monitoring. The power meter 100 can enter system running state 240 when no error occurs during power meter initialization or power meter monitoring. The power meter 100 can also enter system running state 240 when the power meter is switched to an emergency mode. The critical error, noncritical error, and emergency mode will be discussed in the following.

Figure 3:
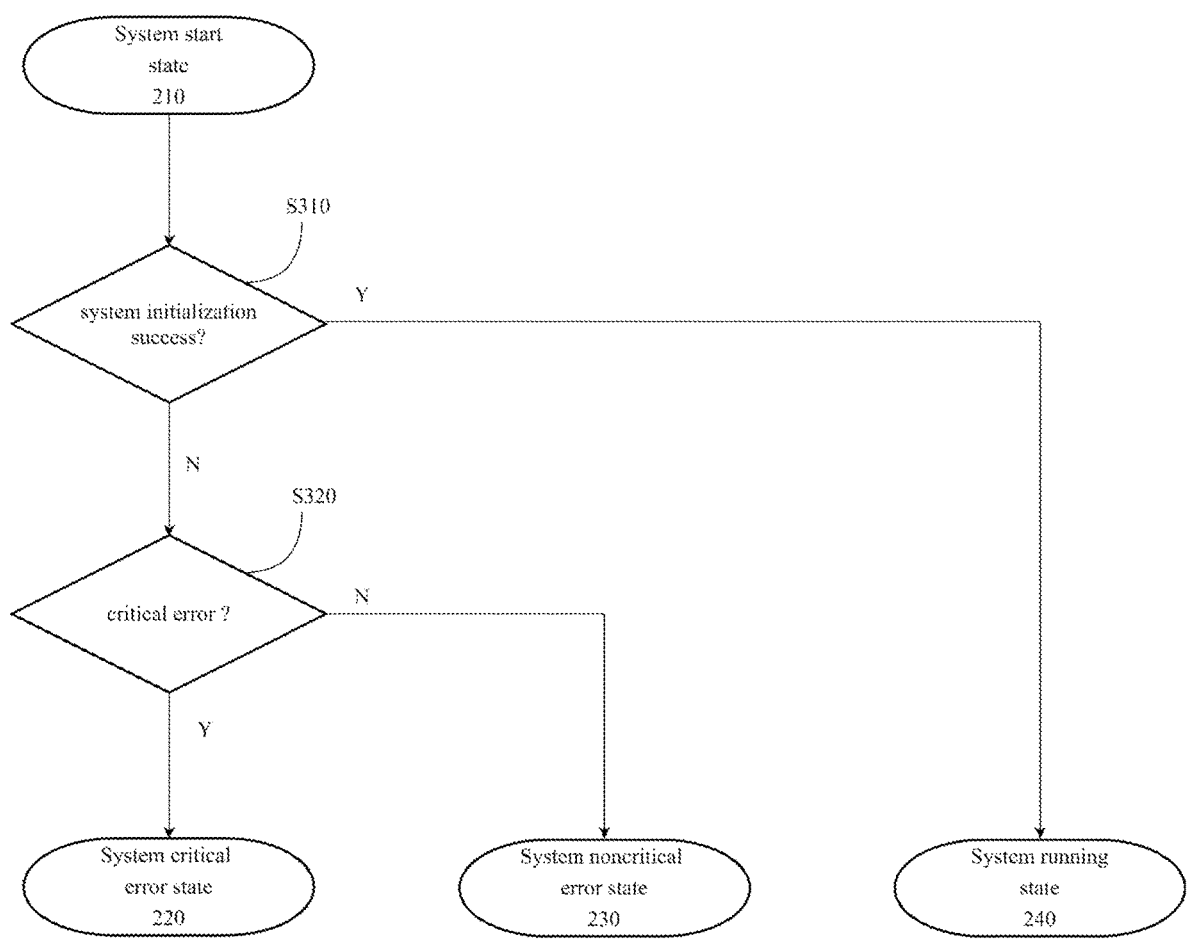
FIG. 3 is a flowchart illustrating an exemplary initialization process of the power meter according to an exemplary embodiment of the present disclosure.

FIG. 3 presents an embodiment of a flowchart 300 that illustrates the power meter 100 initialization process corresponding to FIG. 2. When the power meter 100 starts, it can enter the system start state 210. Then the power meter 100 can initialize the related resource. The corresponding resource initialization can make for a system initialization. In an illustrative embodiment, the power meter 100 can configure the application environment to initialize related application information. The power meter 100 can configure the hardware environment to initialize the power meter device information. The power meter may configure the Linux environment to initialize the Linux environment information. The power meter 100 can start a management thread to manage the service threads and monitor the service threads.

In an illustrative embodiment, the service threads may be initialized by the management thread. Each service thread can be used to implement one or more power meter functions. The service thread may be an e-mail thread for managing e-mail sending or receiving, a BACnet thread for implementing a communication protocol for Building Automation and Control (BAC), a meter thread for measuring the electricity usage at a metering point, a DNP thread for implementing Distributed Network Protocol (DNP), a Modbus thread for implementing Modbus protocol, an SNMP thread for implementing a Simple Network Management Protocol (SNMP) stack, etc. After all the service threads are created, the system initialization finishes.

The main functionality of a power meter may be to measure the electricity usage at a metering point. During the power meter initialization, the errors that affect the main functionality may be named critical errors. The errors that may not affect the main functionality may be called noncritical errors. The meter thread can be critical since it can implement the main functionality of a power meter. On the other hand, the management thread may also critical since it can initialize the meter thread. The other threads, such as e-mail thread, BACnet thread, DNP thread, Modbus thread, or SNMP thread, are noncritical threads since they support the auxiliary functions of the power meter. Even if the noncritical threads work abnormally, the power meter user can collect the necessary electricity usage data for electricity billing purposes.

If there is an error during the meter thread initialization, the error may be a critical error. However, if there is an error during other service thread initialization, the error may be a noncritical error. The foregoing application configuration, hardware configuration, Linux environment configuration, and management thread creation are used to prepare the environment for the service thread. Therefore, if there is an error during these operations, the error would be a critical error since the meter thread would fail to work without these preparations.

In step S310, the power meter can judge whether the power meter initialization is successful or if it failed. If there is no error during the power meter initialization, the power meter 100 can enter a system running state 240. If there is any error occurring during the power meter initialization, step S320 can be executed.

In step S320, the power meter 100 can determine whether the error is a critical error or a noncritical error. If the error is critical, the power meter 100 can enter a system critical error state 220. If the error is noncritical, the power meter 100 can enter a system noncritical error state 230.

Figure 4:
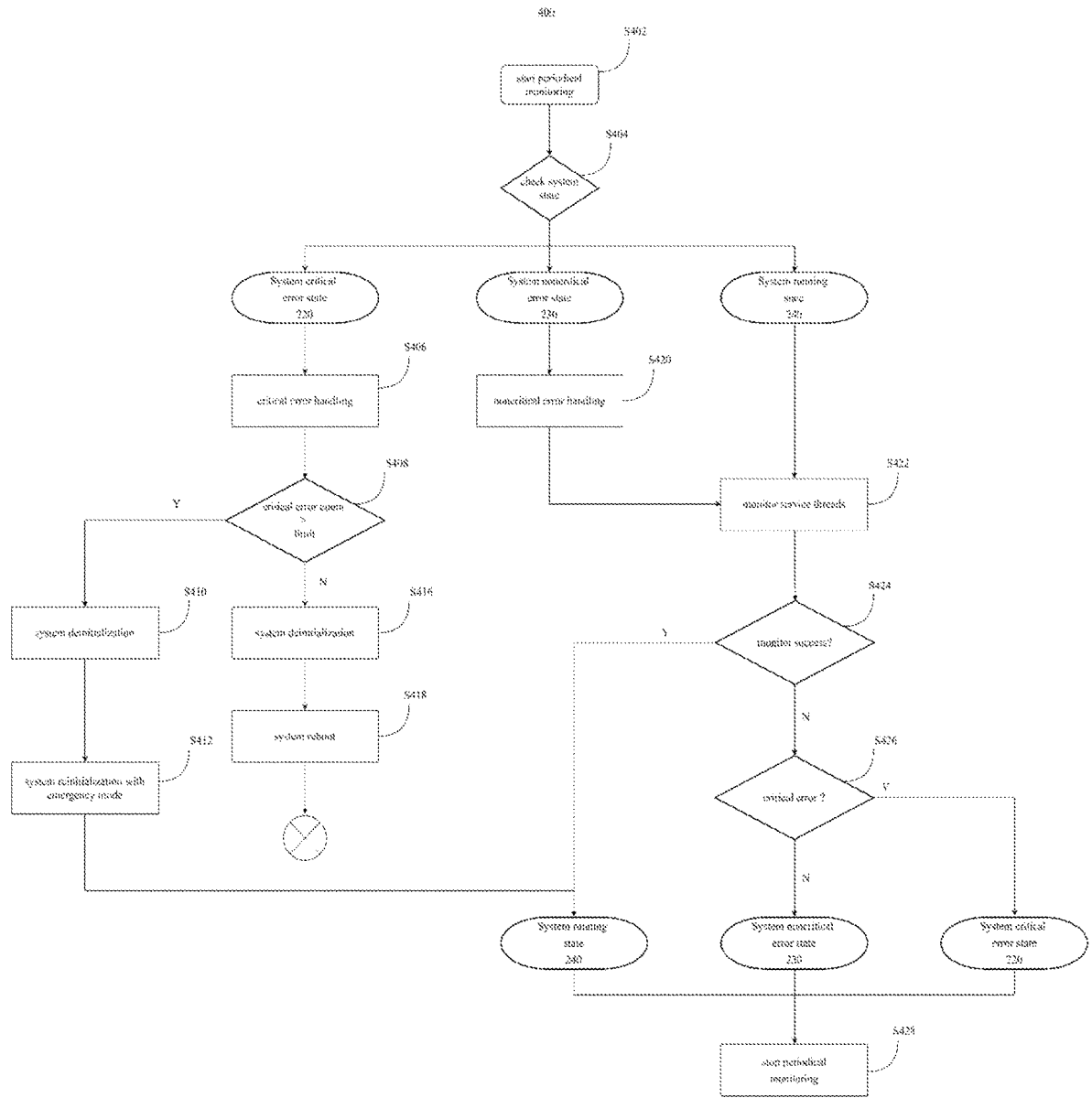
FIG. 4 is a flowchart showing an exemplary monitoring process of the power meter according to an exemplary embodiment of the present disclosure.

FIG. 4 is a flowchart 400 that illustrates an embodiment of the power meter monitoring process corresponding to FIG. 2. After a power meter initialization completes, the management thread can periodically monitor the power meter. In step S402, the management thread can start a periodical monitoring. In step S404, the management thread can check the current power meter state.

If the power meter 100 is in a system critical error state 220, the power meter 100 can execute step S406. In step S406, the power meter can make some preparations before a system deinitialization starts. The preparations may include recording the critical error related information in the persistent memory, such as a MultiMediaCard, and obtaining the occurrence frequency that critical errors occur during a specified period, such as 24 hours.

In step S408, the power meter can judge whether the occurrence frequency of critical errors occurring during a specified period exceeds a predetermined threshold. If the occurrence frequency is greater than a predetermined threshold, the power meter 100 can execute step S410. In step S410, the power meter 100 can deinitialize. In step S412, the power meter 100 can reinitialize in emergency mode. The emergency mode can make it possible to update the firmware and/or collect the required log information. Only network functionality of the power meter may be enabled in the emergency mode. In an illustrative embodiment, the network functionality may include network service and webserver service. The network service provides a connection between the power meter and an external user. The webserver service provides web-based access for the external user. The network functionality may include network service and TFTP (Trivial File Transfer Protocol) service in another embodiment. The TFTP service can allow an external user to remotely retrieve a file from the power meter or load a file onto the power meter. After the system deinitialization, the power meter can enter system running state 240 with an emergency mode.

Before the power meter is switched into the emergency mode, the power meter can notify the user. In an illustrative embodiment, the power meter may notify the user that the power meter can be in emergency mode by e-mail or SMS (Short Message Service).

Figure 5:
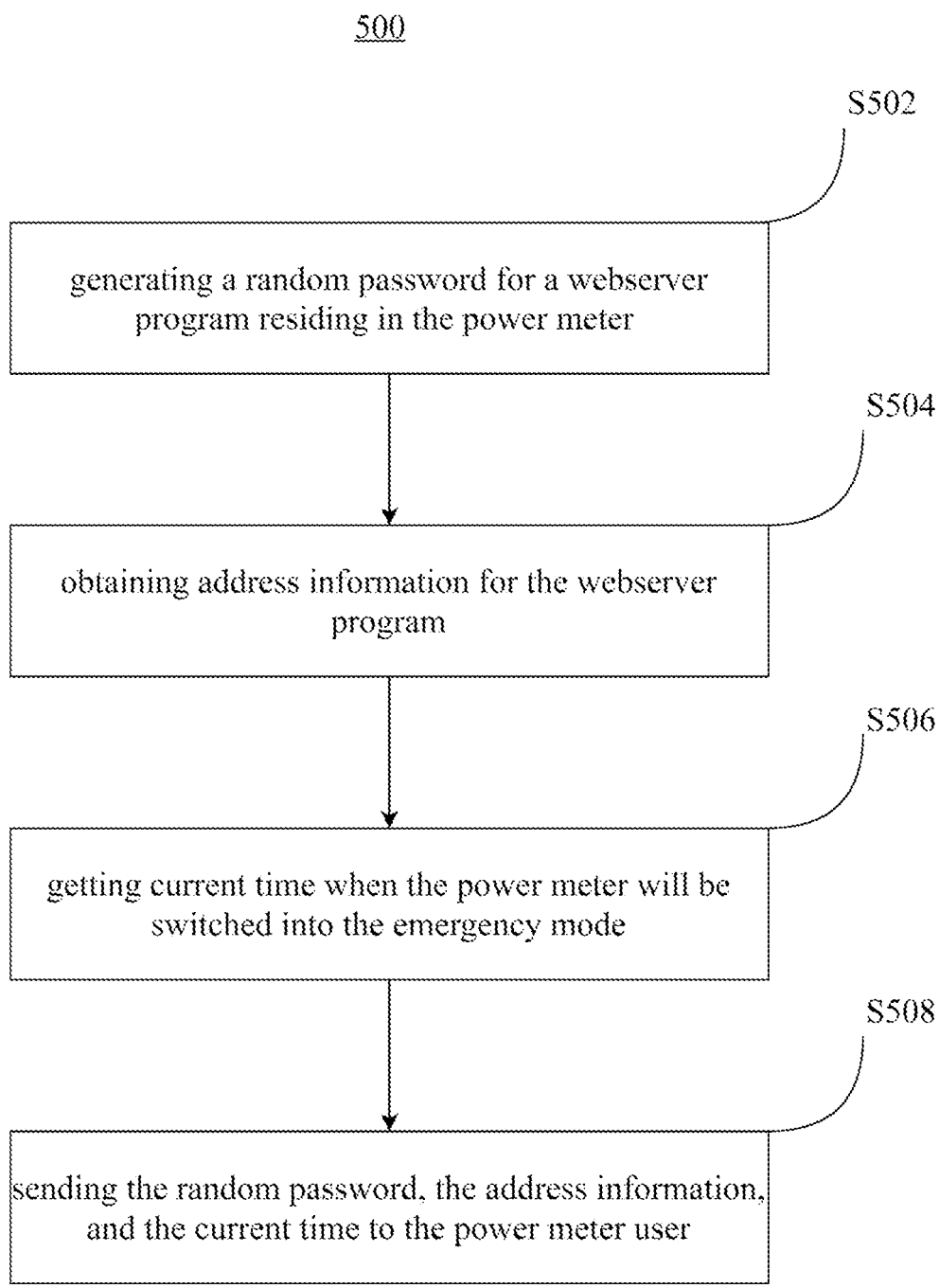
FIG. 5 is a flowchart demonstrating an emergency mode notification process of the power meter according to an exemplary embodiment of the present disclosure.

FIG. 5 is a diagram illustrating an embodiment of the emergency mode notification process. In step S502, the power meter can generate a random password for a webserver program residing in the power meter. The webserver program may be CivetWeb. The webserver may provide a user interface for the remoter visitor to update the power meter firmware and get the required log information. The random password may be provided to the user as access authorization. In some embodiments, the user may be required to input the random password when logging in to the power meter remotely. In step S504, the power meter obtains address information for the webserver. The address information for the webserver may be an IP address. The user can access the webserver by the IP address. In step S506, the power meter can get the current time. The time information can help the user to know exactly when the emergency mode is enabled. In step S508, the power meter can generate an emergency mode notification combining the random password, the address information, and the current time. The emergency mode notification can be sent to the user. In an illustrative embodiment, the notification may be encrypted by a public key stored in the power meter. The user can decrypt the notification by the corresponding private key.

If the occurrence frequency of critical errors is less than the predetermined threshold, the power meter 100 can execute step S416. In step S416, the power meter 100 can deinitialize. In step S418, the power meter can reboot after the deinitialization. The power meter 100 can record a Linux snapshot before rebooting the power meter 100 for further analysis.

If the power meter 100 is in system noncritical error state 230 after step S404, the power meter 100 can handle the noncritical error. The handling may include restarting the failed service thread that is experiencing the noncritical running error. The power meter 100 can log the failure information before restarting the noncritical thread. Then the power meter 100 can execute step S422.

If the power meter 100 is in system running state 240 after step S404, the power meter 100 can directly execute step S422. In step S422, the management thread may monitor the status of service threads. The status of service threads may include a loop count of each thread during a period, a load of each thread, a resource operation status of each thread or a combination thereof.

A thread can be implemented in an infinite loop. A counter may be set to calculate the loop count in a service thread. The loop count can indicate how many times the loop is executed in a service thread. The purpose of the counter may be to observe whether a thread is dead. In one embodiment, each service thread may send the value of its counter to the management value periodically. If the management thread cannot receive the value of a service thread's counter during a specified period, the management thread considers an error happening in this service thread. If the management thread can receive the value of a service thread's counter during a specified period, the management thread can compare the current value with the previous value received. If the current value is greater than the previous value, the management thread considers no error happening in this service thread. If the current value is less than or equal to the previous value, the management thread considers an error happening in this service thread. If the error comes from the meter thread, the management thread considers the error as a critical error. If the error comes from other service threads, the management thread considers the error as a noncritical error.

In another embodiment, the management thread may actively query the value of a service thread's counter. If the management thread cannot get the value of a service thread's counter successfully, the management thread considers an error occurring in this service thread. If the management thread can get the value of a service thread's counter successfully, it can compare the current value of the service thread's counter with the previous value obtained. If the current value is greater than the previous value, the management thread considers no error happening in this service thread. If the current value is less than or equal to the previous value, the management thread considers an error happening in this service thread. If the error comes from a critical thread, such as meter thread, the management thread considers the error as a critical error. If the error comes from other service threads, the management thread considers the error as a noncritical error.

Each service thread also monitors its resource's operation status. The resource of a service thread may include a file, a pipe, a network socket, etc. A file descriptor in Linux and other Unix-like operating systems is a unique identifier for a file or other input/out resources, such as pipe or network socket. Therefore, one service thread may monitor its resource operation by using the file descriptor.

For instance, functions such as open, close or read can be provided to operate the resources in Linux. The open function can open the file specified by pathname. If the specified file does not exist, it may optionally be created by open. A file descriptor can be returned if the file is opened successfully. The close function can close a file descriptor to no longer refer to any file and may be reused. The read function can attempt to read bytes from the file descriptor into a buffer. If a service thread observes that the read function returns an error value, the service thread can call close to close the current file. Then the service thread can call open to create a new file. If there is no longer an error, the service thread can consider this service thread working normally. If there are still errors occurring for the read function, the service thread can consider an error happening in this service thread. If the resource operation error occurs in the meter thread, the error may be considered as a critical error. If the error occurs in other service threads, the error may be considered as a noncritical error. In one embodiment, the service thread can send its resource's operation running status to the management thread. In another embodiment, the service thread can set a flag indicating its resource's operation running status allowing the management thread to query.

In an illustrative embodiment, each service thread may consume Linux system resources, such as CPU and memory, to implement its functionality. The load of each service thread can reflect how many Linux system resources are used by the service thread. If a load of a service thread is always high during a specified period, there may be something wrong with this thread.

During service thread monitoring, a status error that can be received from a critical thread may be considered a critical error and a status error that can be received from a noncritical thread may be considered a noncritical error.

If all the statuses reported by each service thread are successful, the power meter 100 can enter system running state 240. If at least one status reported by each service thread is an error, the power meter 100 can execute step S426. In step S426, the power meter 100 can determine whether one of the at least one status reported is a critical error. If one of the at least one status reported is a critical error, the power meter 100 can enter system critical error state 220. If all statuses reported from service threads are noncritical errors, the power meter 100 can enter a system noncritical error state 230.

In step S428, the power meter 100 can stop the periodical monitoring and wait for the next monitoring period.

In an illustrative embodiment, the management thread may be dead when it monitors service threads. A watchdog program residing in the power meter 100 may be used to reboot the power meter 100 when the management thread is dead. The management thread may periodically feed the watchdog program to indicate that the monitoring functionality is still alive. If the watchdog program cannot be fed in time, it can reboot the power meter 100. In another embodiment, the power meter 100 may be stuck during the initialization. Under some conditions, even the management thread cannot be created since the initialization failure. In this case, the watchdog program can reboot the power meter 100. If the power meter 100 still experiences the initialization failure after reboot, the watchdog program may switch the power meter 100 into an emergency mode where only network functionality is enabled in the power meter.

Figure 6:
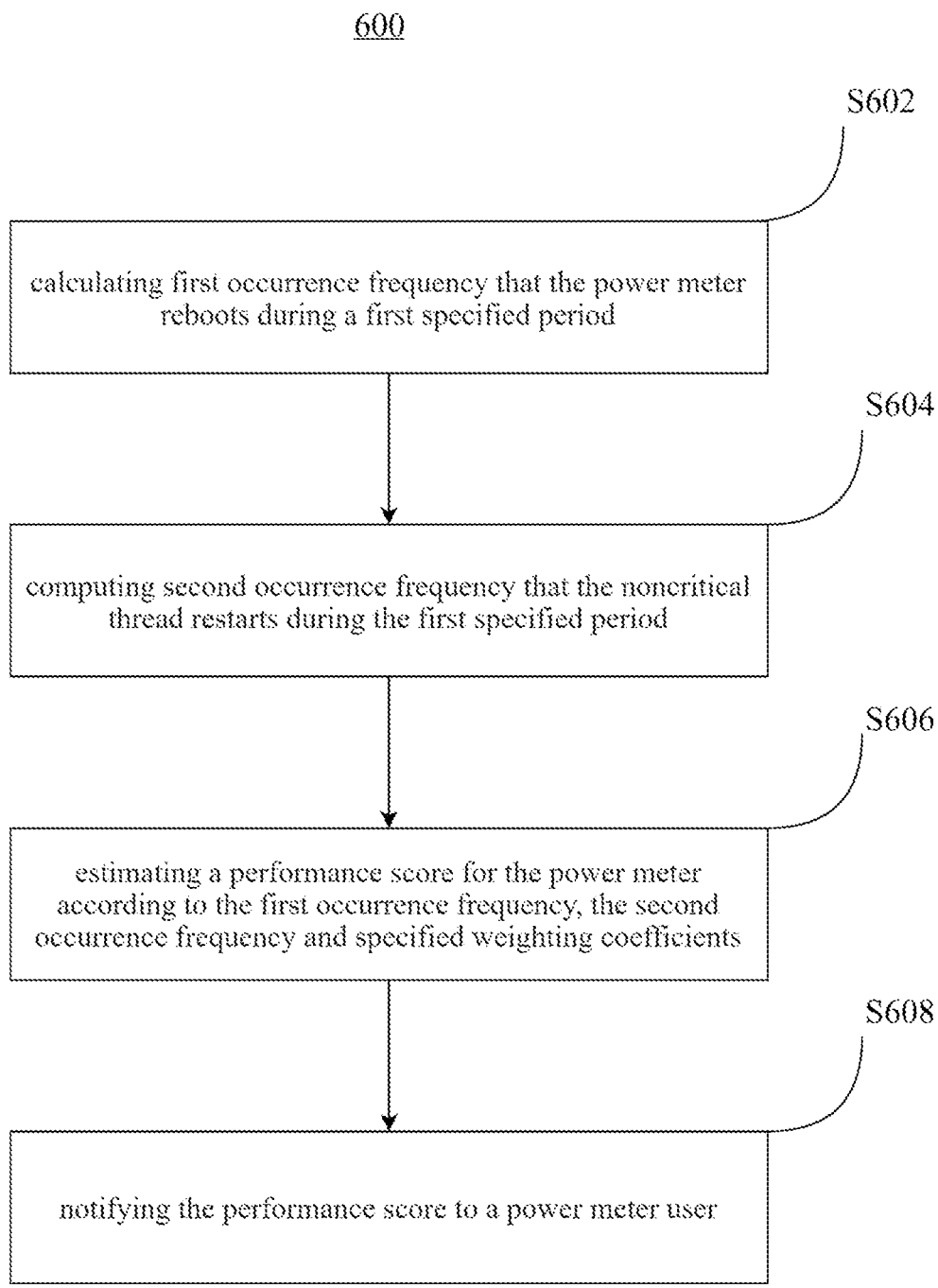
FIG. 6 is a flowchart illustrating a performance score notification process of the power meter according to an exemplary embodiment of the present disclosure.

FIG. 6 is a diagram illustrating a performance score notification process. In step S602, the power meter 100 can calculate a first occurrence frequency of reboots during a first specified period. For instance, the power meter may observe that it reboots three times in 24 hours.

In step S604, the power meter 100 may compute a second occurrence frequency that the noncritical thread restarts during the first specified period. For instance, the power meter can observe that the noncritical thread restarts five times in 24 hours.

In step S606, the power meter 100 may estimate a performance score for the power meter according to the first occurrence frequency, the second occurrence frequency, and specified weighting coefficients. The performance score for the power meter can be calculated as the following equation.

$$S = \alpha \times f_{reboot} + \beta \times f_{restart}$$

Where S represents the performance score, α represents a weighting coefficient for power meter reboot frequency, $f_{reboot}$ represents power meter's reboot frequency for a specified period, β represents a weighting coefficient for thread restart frequency, $f_{restart}$ represents a thread's restart frequency for a specified period. Weighting coefficients α and β can be empirical data.

In step S608, the power meter 100 may notify the performance score to a power meter user. The power meter user can determine how well the power meter runs by the performance score. If the performance score is above a predetermined score, a power meter replacement may be needed. Utility companies can routinely dispatch field crews to replace power meters with lower performance scores.

Embodiments of the teachings of the present disclosure have been described in an illustrative manner. It is to be understood that the terminology, which has been used, is intended to be in the nature of words of description rather than of limitation. Many modifications and variations of the embodiments are possible in light of the above teachings.

Therefore, within the scope of the appended claims, the embodiments can be practiced other than specifically described.

What is claimed is:

1. A method for monitoring a power meter, comprising:
monitoring status of threads running in the power meter, wherein the threads include at least one critical thread for measuring the electricity usage at a metering point and at least one noncritical thread for other auxiliary functions,
rebooting the power meter if the status received from the threads indicates that a critical thread among the at least one critical thread works abnormally,
restarting the noncritical thread if the status received from the threads indicates that a noncritical thread among the at least one noncritical thread works abnormally,
counting the occurrence frequency that the critical thread works abnormally during a specified period,
switching the power meter into an emergency mode where only network functionality is enabled in the power meter if the occurrence frequency exceeds a predetermined frequency threshold,
notifying a power meter user that the power meter will be switched into the emergency mode, wherein the notification comprises:
generating a random password for a webserver program residing in the power meter, wherein the webserver program allows a power meter user to collect the power meter's log information or update the power meter firmware,
obtaining address information for the webserver program,
getting current time when the power meter will be switched into the emergency mode,
sending the random password, the address information, and the current time to the power meter user.

2. The method of claim 1, further comprising:
periodically feeding a watchdog program to indicate that the monitoring functionality is still alive.

3. A method for monitoring a power meter, comprising:
monitoring status of threads running in the power meter, wherein the threads include at least one critical thread for measuring the electricity usage at a metering point and at least one noncritical thread for other auxiliary functions,
rebooting the power meter if the status received from the threads indicates that a critical thread among the at least one critical thread works abnormally,
restarting the noncritical thread if the status received from the threads indicates that a noncritical thread among the at least one noncritical thread works abnormally,
calculating first occurrence frequency that the power meter reboots during a first specified period,
computing second occurrence frequency that the noncritical thread restarts during the first specified period,
estimating a performance score for the power meter according to the first occurrence frequency, the second occurrence frequency and specified weighting coefficients,
notifying the performance score to a power meter user.

4. A method for monitoring a power meter, comprising:
monitoring status of threads running in the power meter, wherein the threads include at least one critical thread for measuring the electricity usage at a metering point and at least one noncritical thread for other auxiliary functions,
rebooting the power meter if the status received from the threads indicates that a critical thread among the at least one critical thread works abnormally,
restarting the noncritical thread if the status received from the threads indicates that a noncritical thread among the at least one noncritical thread works abnormally,
wherein the status of threads including includes at least one of the following information:
a loop count of each thread during a second period,
a load of each thread,
a resource operation status of each thread.

5. A method for monitoring a power meter, comprising:
monitoring status of threads running in the power meter, wherein the threads include at least one critical thread for measuring the electricity usage at a metering point and at least one noncritical thread for other auxiliary functions,
rebooting the power meter if the status received from the threads indicates that a critical thread among the at least one critical thread works abnormally,
restarting the noncritical thread if the status received from the threads indicates that a noncritical thread among the at least one noncritical thread works abnormally,
recording a Linux snapshot before rebooting the power meter, and
logging the failure information before restarting the noncritical thread.

6. A method for monitoring a power meter, comprising:
monitoring status of threads running in the power meter, wherein the threads include at least one critical thread for measuring the electricity usage at a metering point and at least one noncritical thread for other auxiliary functions,
rebooting the power meter if the status received from the threads indicates that a critical thread among the at least one critical thread works abnormally,
restarting the noncritical thread if the status received from the threads indicates that a noncritical thread among the at least one noncritical thread works abnormally,
monitoring the power meter initialization process,
switching the power meter into an emergency mode where only network functionality is enabled in the power meter if the critical thread cannot normally work due to the failing power meter initialization.

7. A power meter comprising:
at least one sensor configured for sensing at least one electrical parameter of electrical power distributed from an electrical distribution system to a load;
at least one analog-to-digital converter coupled to the at least one sensor and configured for converting an analog signal output from the at least one sensor to digital data;
at least one processing module coupled to the at least one analog-to-digital converter, the at least one processing module is configured to:
monitor status of threads running in the power meter, wherein the threads include at least one critical thread for measuring the electricity usage at a metering point and at least one noncritical thread for other auxiliary functionalities,
reboot the power meter if the status received from the threads indicates that a critical thread among the at least one critical thread works abnormally,
restart the noncritical thread if the status received from the threads indicates that a noncritical thread among the at least one noncritical thread works abnormally, calculate first occurrence frequency that the power meter reboots during a first specified period,
compute second occurrence frequency that the noncritical thread restarts during the first specified period,
estimate a performance score for the power meter according to the first occurrence frequency, the second occurrence frequency and specified weighting coefficients,
notify the performance score to a power meter user.

8. The power meter of claim 7, the at least one processing module is further configured to:
count the occurrence frequency that the critical thread works abnormally during a specified period,
switch the power meter into an emergency mode where only network functionality is enabled in the power meter if the occurrence frequency exceeds a predetermined frequency threshold.

* * * * *